United States Patent
Lu et al.

[11] Patent Number: 6,146,968
[45] Date of Patent: Nov. 14, 2000

[54] METHOD FOR FORMING A CROWN CAPACITOR

[75] Inventors: Yii-Chian Lu, Taipei; Chine-Gie Lou, Hsinchu Hsien; Shin-Puu Jeng, Hsinchu, all of Taiwan

[73] Assignee: Taiwan Semiconductor Manufacturing Corp., Hsinchu, Taiwan

[21] Appl. No.: 09/209,047

[22] Filed: Dec. 9, 1998

[51] Int. Cl.⁷ .................................................. H01L 21/20
[52] U.S. Cl. ........................ 438/398; 438/396; 438/397; 438/253; 438/255
[58] Field of Search .................... 438/253, 254, 438/255, 396, 397, 398

[56] References Cited

U.S. PATENT DOCUMENTS

| | | | |
|---|---|---|---|
| 5,340,765 | 8/1994 | Dennison et al. | 438/398 |
| 5,354,705 | 10/1994 | Mathews et al. | 438/397 |
| 5,444,013 | 8/1995 | Akram et al. | 438/398 |
| 5,763,306 | 6/1998 | Tsai | 438/255 |
| 5,849,624 | 12/1998 | Fazan et al. | 438/398 |
| 5,956,587 | 9/1999 | Chen et al. | 438/255 |

*Primary Examiner*—Carl Whitehead, Jr.
*Assistant Examiner*—Jamie L. Davis
*Attorney, Agent, or Firm*—Blakely, Sokoloff, Taylor & Zafman LLP

[57] ABSTRACT

A method for forming a bottom storage node of a capacitor for a DRAM memory cell on a substrate is disclosed. The method comprises the steps of: forming a first oxide layer onto the substrate; forming a conductive contact plug in the first oxide layer, the contact plug extending down to the substrate; forming a second oxide layer over the first oxide layer and the contact plug; forming a silicon nitride layer over the second oxide layer; patterning and etching the silicon nitride layer and the second oxide layer to form a trench over the contact plug; forming a layer of rugged insitu doped polysilicon layer over the silicon nitride layer and along the walls and bottom of the trench; depositing a photoresist layer over the rugged insitu doped polysilicon layer and filling the trench; performing a first reactive ion etching step until the rugged insitu doped polysilicon layer lying on the silicon nitride layer is reached; performing a second reactive ion etching step until the rugged insitu doped polysilicon layer lying on the silicon nitride layer is removed, the second reactive ion etching step formulated to remove the rugged insitu doped polysilicon layer faster than the photoresist layer; and performing a chemical dry etching step to smooth out the sharp corners of the rugged polysilicon layer.

6 Claims, 3 Drawing Sheets

METHOD FOR FORMING A CROWN CAPACITOR

FIELD OF THE INVENTION

The present invention relates generally to semiconductor manufacturing processes, and more particularly, to a method for forming a crown capacitor without using a chemical mechanical polishing (CMP) step.

BACKGROUND OF THE INVENTION

It has been a recent trend in dynamic random access memory (DRAM) to increase the density of DRAM integrated circuits. However, as higher density DRAM cells are developed, the area available for capacitors that are used in the DRAM cells decreases. In order to decrease the area of capacitors while maintaining reliability standards, it is important to be able to maintain the capacitance of each capacitor while decreasing its footprint. Recently, capacitors having a three-dimensional structure have been suggested to increase cell capacitance. One such capacitor is the crown capacitor.

There is also a challenge to develop methods of manufacturing these capacitors that minimize the manufacturing costs and provide maximum process tolerance to maximize product yields. The present invention is directed to such an improved capacitor.

SUMMARY OF THE INVENTION

A method for forming a bottom storage node of a capacitor for a DRAM memory cell on a substrate is disclosed. The method comprises the steps of: forming a first oxide layer onto said substrate; forming a conductive contact plug in said first oxide layer, said contact plug extending down to said substrate; forming a second oxide layer over said first oxide layer and said contact plug; forming a silicon nitride layer over said second oxide layer; patterning and etching said silicon nitride layer and said second oxide layer to form a trench over said contact plug; forming a layer of rugged insitu doped polysilicon layer over said silicon nitride layer and along the walls and bottom of said trench; depositing a photoresist layer over said rugged insitu doped polysilicon layer and filling said trench; performing a first reactive ion etching step until said rugged insitu doped polysilicon layer lying on said silicon nitride layer is reached; performing a second reactive ion etching step until said rugged insitu doped polysilicon layer lying on said silicon nitride layer is removed, said second reactive ion etching step formulated to remove said rugged insitu doped polysilicon layer faster than said photoresist layer; and performing a chemical dry etching step to smooth out the sharp corners of said rugged polysilicon layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
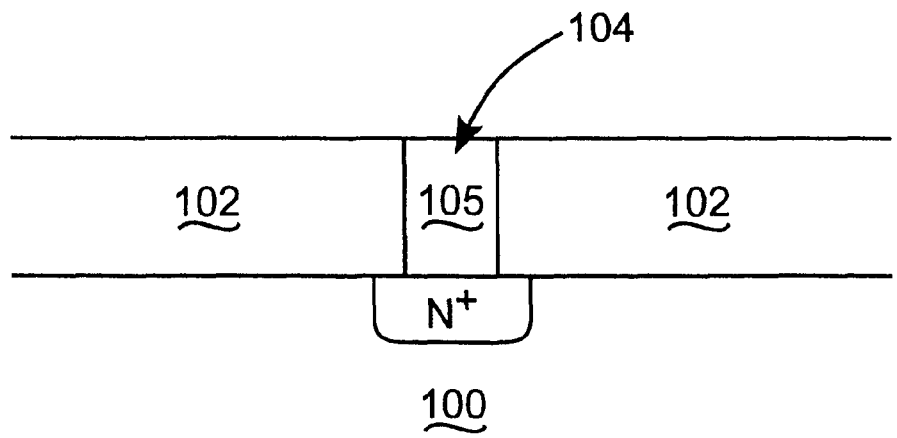
FIGS. 1–5 are cross-sectional views of a semiconductor substrate, illustrating the steps of the present invention.

The present invention will be described in detail with reference to the accompanying drawings. Turning to FIG. 1, a semiconductor substrate 100 is shown. The substrate is understood to include possibly a semiconductor wafer, active and passive devices formed within the wafer, and layers formed on the wafer's surface. Thus, the term "substrate" is meant to include devices formed within a semiconductor wafer and the layers overlying the wafer.

In FIG. 1, an insulating layer 102 is formed atop the substrate 100. The insulating layer may be formed from silicon oxide, borophosphosilicate glass (BPSG), tetraethylorthosilicate glass (TEOS), spin-on glass (SOG), fluorine doped oxide, or any combination thereof. A contact opening 104 is formed within the insulating layer 102. The contact opening preferably is above the source or drain of an access transistor as is conventional in the prior art for forming a DRAM capacitor. The contact opening 104 is preferably made using conventional photolithography and etching techniques. The etching is controlled to stop when the substrate 100 is reached.

Next, an in situ doped polysilicon plug is formed within the contact opening 104. The polysilicon plug 105 can be formed using one of the conventional methods for forming a polysilicon plug, including, but not limited to, depositing a polysilicon layer into the contact opening 104 and atop the oxide layer 102 and then removing the polysilicon layer 105 above the oxide layer 102 either by a reactive ion etching back or by chemical mechanical polishing. The resultant polysilicon plug 105 is shown in FIG. 1 filling the contact opening 104.

Figure 2:
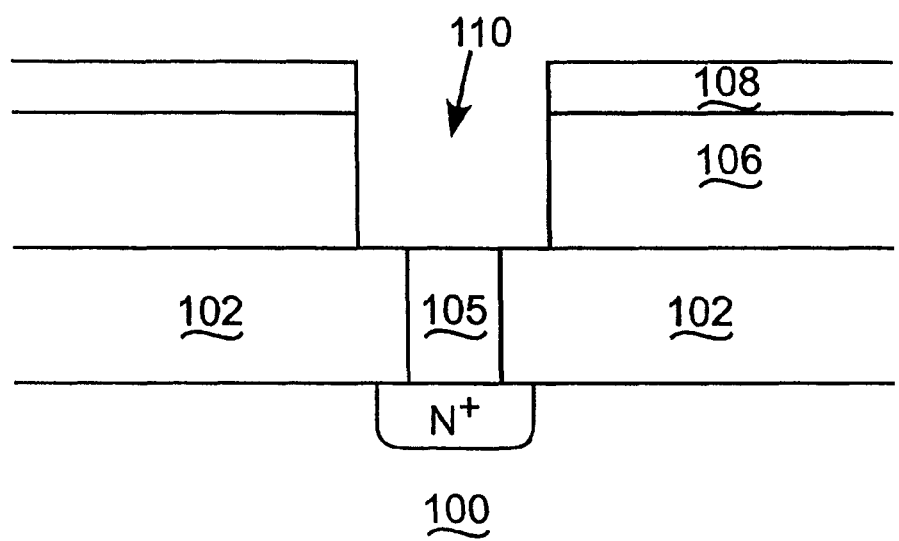

Next, turning to FIG. 2, a second oxide layer 106 is deposited over the first oxide layer 102. Like the first oxide layer 102, the second oxide layer 106 may be comprised of BPSG, TEOS oxide, SOG, fluorine doped oxide, or any combination thereof. Preferably, the thickness of the second oxide layer 106 is approximately 5000 angstroms thick. Deposited atop the second oxide layer 106 is a silicon nitride layer 108. The silicon nitride layer is preferably 500 angstroms thick. The oxide layer 106 and the nitride layer 108 can be formed using conventional methods such as chemical vapor deposition.

Still referring to FIG. 2, using conventional photolithography and etching techniques, a capacitor opening 110 is formed in the silicon nitride layer 108 and the second oxide layer 106. The capacitor opening 110 preferably has a width of 0.36 microns and extends downwardly until the surface of the polysilicon plug 105 and the first oxide layer 102 have been reached.

Figure 3:
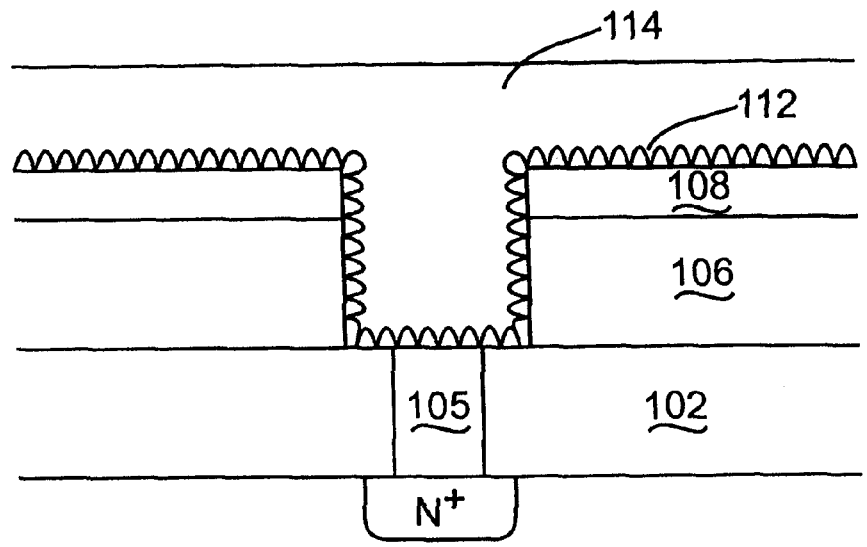

Next, turning to FIG. 3, a rugged polysilicon layer 112 is formed over the silicon nitride layer 108 and into the capacitor opening 110. In the preferred embodiment, the rugged polysilicon layer 112 may be formed by four thin layers of in situ doped polysilicon followed by a thermal anneal. Alternatively, the rugged polysilicon layer 112 may be formed from a single layer of rugged polysilicon. The deposition process for forming rugged polysilicon is well-known in the art and reference is made to U.S. Pat. No. 5,811,344 to Tu et al. and U.S. Pat. No. 5,037,773 to Lee et al. Preferably, the rugged polysilicon layer 112 has a thickness of 700 angstroms.

Next, a thin layer of photoresist is coated over the entire wafer thereby filling the capacitor opening 110 and covering the rugged polysilicon layer 112. The photoresist used may be any commercially available photoresist.

Next, a series of etching back steps are performed. In the preferred embodiment, there are three etching steps. The first etch back step involves removing the portion of the photoresist layer 114 that is above the rugged polysilicon layer 112 lying above the silicon nitride layer 108. In this first etching, the etching rate of the rugged polysilicon layer 112 and the photoresist layer is approximately equal. In the preferred embodiment, the recipe for the first etching is conducted on a model TCP etching apparatus at 150–200 watts power, with 200–250 watts bias power, 10–20 sccm of $O_2$, and 50–80 sccm of $Cl_2$.

Next, after the rugged polysilicon layer is reached, a second etching takes place. In particular, the etching recipe for the second etching is changed for the etch back such that the etching rate of the rugged polysilicon layer 112 relative to the photoresist layer is approximately 1.5–2:1. In addition, this second etching recipe has an extremely low etch rate for the silicon nitride layer 108. In the preferred embodiment, the recipe for the second etching is conducted on a model TCP etching apparatus at 150–200 watts power, with 70–120 watts bias power, 50–90 sccm of HBr, and 60–100 sccm of $Cl_2$.

Figure 4:
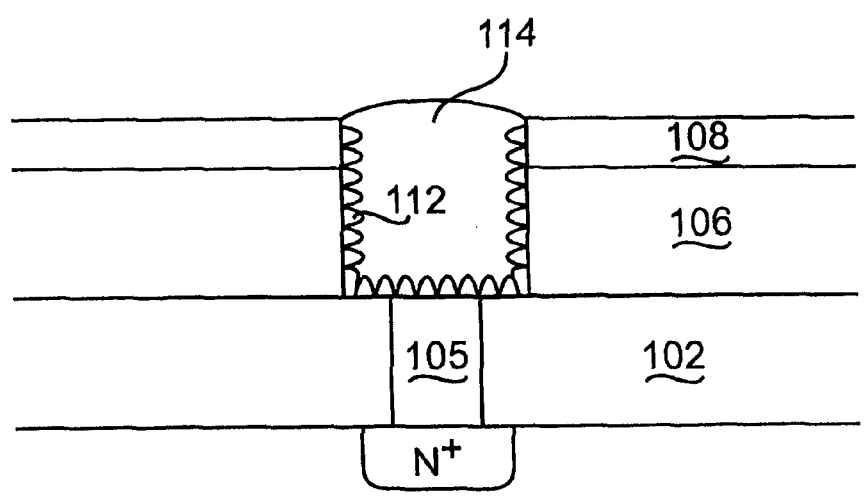
Figure 5:
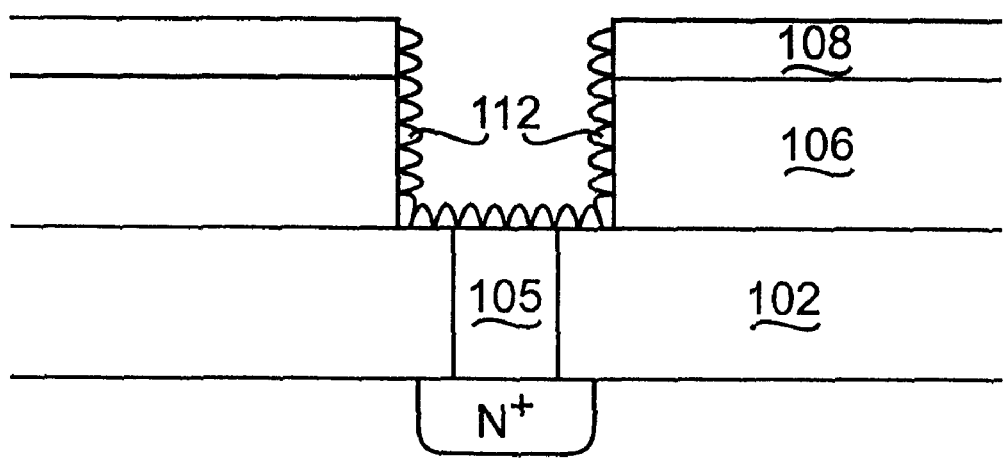

The result of the second etching recipe is that a photoresist hump is formed above the capacitor opening 110. This is because the rugged polysilicon layer 112 is removed more quickly than the photoresist layer 114. The result is shown in FIG. 4. By changing the recipe so that the photoresist hump 114 is formed, the rugged polysilicon layer 112 is prevented from recessing into the capacitor opening 110. The photoresist hump 114 is subsequently removed using a wet etching process.

Finally, the third etching is a "soft etch" employing a chemical dry etching technique to remove any sharp tips in the rugged polysilicon layer 112. It can be appreciated by those skilled in the art that a normal reactive ion etching will tend to cause sharp tips in rugged polysilicon which will subsequently induce dielectric defects in the capacitor. Thus, the chemical dry etching technique is used to smooth out sharp tips in the rugged polysilicon layer. In the preferred embodiment, the recipe for the third etching is conducted on a model TCP etching apparatus at 150–200 watts power, with 5–30 watts bias power, 20–60 sccm of $CF_4$, and 3–8 sccm of $HeO_2$. Note that any remaining photoresist will be removed by conventional ashing and wet clean.

Furthermore, the use of the silicon nitride layer 108 as a cap layer above the second oxide layer 106 is advantageous because a subsequent nitride/oxide dielectric can be grown with a normal low pressure furnace. Without the silicon nitride layer 108, the growth of the nitride/oxide layer will require an FTPS equipped high pressure $NH_3$ nitridation treatment.

An additional advantage of the silicon nitride layer 108 is its ability to improve corner thinning. It has been found that the silicon nitride layer 108 improves corner thinning that would otherwise reduce the electrical integrity of the capacitor. The corner thinning phenomenon is detailed in "Stacked Capacitor Cell With Integrated HF Vapor Etch" by Yoshimaru et al., IEDM, December 1992.

Note that the present invention does not require chemical mechanical polishing (CMP). This will in turn lessen the thickness requirement of the second oxide layer 106.

Finally, to complete formation of the capacitor a thin nitride/oxide dielectric layer is deposited into the capacitor opening 110 and over the rugged polysilicon layer 112. This is followed by the formation of a plate polysilicon layer that will service as the top storage node of the capacitor. The foregoing steps are conventional in the art.

In an alternative embodiment, the rugged polysilicon layer 112 is replaced with amorphous silicon. The amorphous silicon is flat and therefore requires less reactive ion etching to clear, which in turn helps to suppress the sharp corners of the polysilicon post reactive ion etch. The amorphous silicon is then followed by an HSG polysilicon layer which will be needed to improve the area gain.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for forming a bottom storage node of a capacitor for a DRAM memory cell on a substrate, the method comprising the steps of:

forming a first oxide layer onto said substrate;

forming a conductive contact plug in said first oxide layer, said contact plug extending down to said substrate;

forming a second oxide layer over said first oxide layer and said contact plug;

forming a silicon nitride layer over said second oxide layer;

patterning and etching said silicon nitride layer and said second oxide layer to form a trench over said contact plug;

forming a rugged insitu doped polysilicon layer having hemispherical grains over said silicon nitride layer and along the walls and bottom of said trench;

depositing a photoresist layer over said rugged insitu doped polysilicon layer and filling said trench;

performing a first reactive ion etching step until said rugged insitu doped polysilicon layer lying on said silicon nitride layer is reached;

performing a second reactive ion etching step until said rugged insitu doped polysilicon layer lying on said silicon nitride layer is removed, said second reactive ion etching step formulated to remove said rugged insitu doped polysilicon layer faster than said photoresist layer, thereby forming a photoresist hump above said trench;

removing said photoresist layer hump by an etching process;

performing a chemical dry etching step to smooth out the sharp tips of the hemispherical grains of said insitu doped rugged polysilicon layer; and depositing a nitride/oxide dielectric layer onto said rugged insitu doped polysilicon in said trench.

2. The method of claim 1, after the step of depositing said nitride/oxide dielectric layer, further including the step of depositing a plate polysilicon layer over said nitride/oxide dielectric layer.

3. The method of claim 1, wherein:

said first etching is conducted on a model TCP etching apparatus at 150–200 watts power, with 200–250 watts bias power, 10–20 sccm of $O_2$, and 50–80 sccm of $Cl_2$;

said second etching is conducted on a model TCP etching apparatus at 150–200 watts power, with 70–120 watts bias power, 50–90 sccm of HBr, and 60–100 sccm of $Cl_2$; and said chemical dry etching is conducted on a model TCP etching apparatus at 150–200 watts power, with 5–30 watts bias power, 20–60 sccm of $CF_4$, and 3–8 sccm of $HeO_2$.

4. A method for forming a bottom storage node of a capacitor for a DRAM memory cell on a substrate, the method comprising the steps of:

forming a first oxide layer onto said substrate;

forming a conductive contact plug in said first oxide layer, said contact plug extending down to said substrate;

forming a second oxide layer over said first oxide layer and said contact plug;

forming a silicon nitride layer over said second oxide layer;

patterning and etching said silicon nitride layer and said second oxide layer to form a trench over said contact plug;

forming an amorphous silicon layer over said silicon nitride layer and along the walls and bottom of said trench;

forming a HSG polysilicon layer over said amorphous silicon layer;

depositing a photoresist layer over said HSG polysilicon layer and filling said trench;

performing a first reactive ion etching step until said HSG polysilicon layer and amorphous silicon layer lying on said silicon nitride layer is reached;

performing a second reactive ion etching step until said HSG polysilicon layer and amorphous silicon layer lying on said silicon nitride layer is removed, said second reactive ion etching step formulated to remove said HSG polysilicon layer and amorphous silicon layer faster than said photoresist layer, thereby forming a photoresist hump above said trench;

removing said photoresist layer by an etching process;

performing a chemical dry etching step to smooth out any sharp tips on the hemispherical grains of the HSG polysilicon layer; and depositing a nitride/oxide dielectric layer onto said HSG polysilicon layer in said trench.

5. The method of claim 4 after the step of depositing said nitride/oxide dielectric layer, further including the step of depositing a plate polysilicon layer over said nitride/oxide dielectric layer.

6. The method of claim 4 wherein:

said first etching is conducted on a model TCP etching apparatus at 150–200 watts power, with 200–250 watts bias power, 10–20 sccm of $O_2$, and 50–80 sccm of $Cl_2$;

said second etching is conducted on a model TCP etching apparatus at 150–200 watts power, with 70–120 watts bias power, 50–90 sccm of HBr, and 60–100 sccm of $Cl_2$; and said chemical dry etching is conducted on a model TCP etching apparatus at 150–200 watts power, with 5–30 watts bias power, 20–60 sccm of $CF_4$, and 3–8 sccm of $HeO_2$.

* * * * *